United States Patent [19]

Tam

[11] 4,045,690
[45] Aug. 30, 1977

[54] HIGH SPEED DIFFERENTIAL TO TTL CONVERTER

[75] Inventor: Richard K. W. Tam, Poway, Calif.

[73] Assignee: Burroughs Corporation, Detroit, Mich.

[21] Appl. No.: 658,705

[22] Filed: Feb. 17, 1976

[51] Int. Cl.² .............................................. H03K 5/20
[52] U.S. Cl. .............................. 307/260; 307/DIG. 1; 307/264; 307/317 A; 307/355
[58] Field of Search ............. 307/DIG. 1, 208, 235 T, 307/235 F, 260, 264, 297, 317 A; 330/30 D

[56] References Cited

U.S. PATENT DOCUMENTS

| | | | |
|---|---|---|---|
| 3,649,926 | 3/1972 | Hill | 330/30 D |
| 3,684,897 | 8/1972 | Anderson et al. | 307/308 |
| 3,857,047 | 12/1974 | Knight | 307/235 T |
| 3,958,135 | 5/1976 | Rosenthal | 307/235 F |

Primary Examiner—Stanley D. Miller, Jr.
Assistant Examiner—B. P. Davis
Attorney, Agent, or Firm—G. Gregory Schivley; Mervyn L. Young; Kevin R. Peterson

[57] ABSTRACT

A high speed circuit for converting CML/ECL gate signals to TTL gate signals. The circuit includes two parallel current paths coupled to a current mirror section in which uniform current is maintained in portions of each path. Each current path includes a transistor which is coupled to the CML/ECL gate for sensing the differential voltage in the gate. The TTL gate is coupled to one of the current paths which steer current into or out of the TTL gate depending upon the differential voltage sensed in the CML/ECL gate.

4 Claims, 2 Drawing Figures

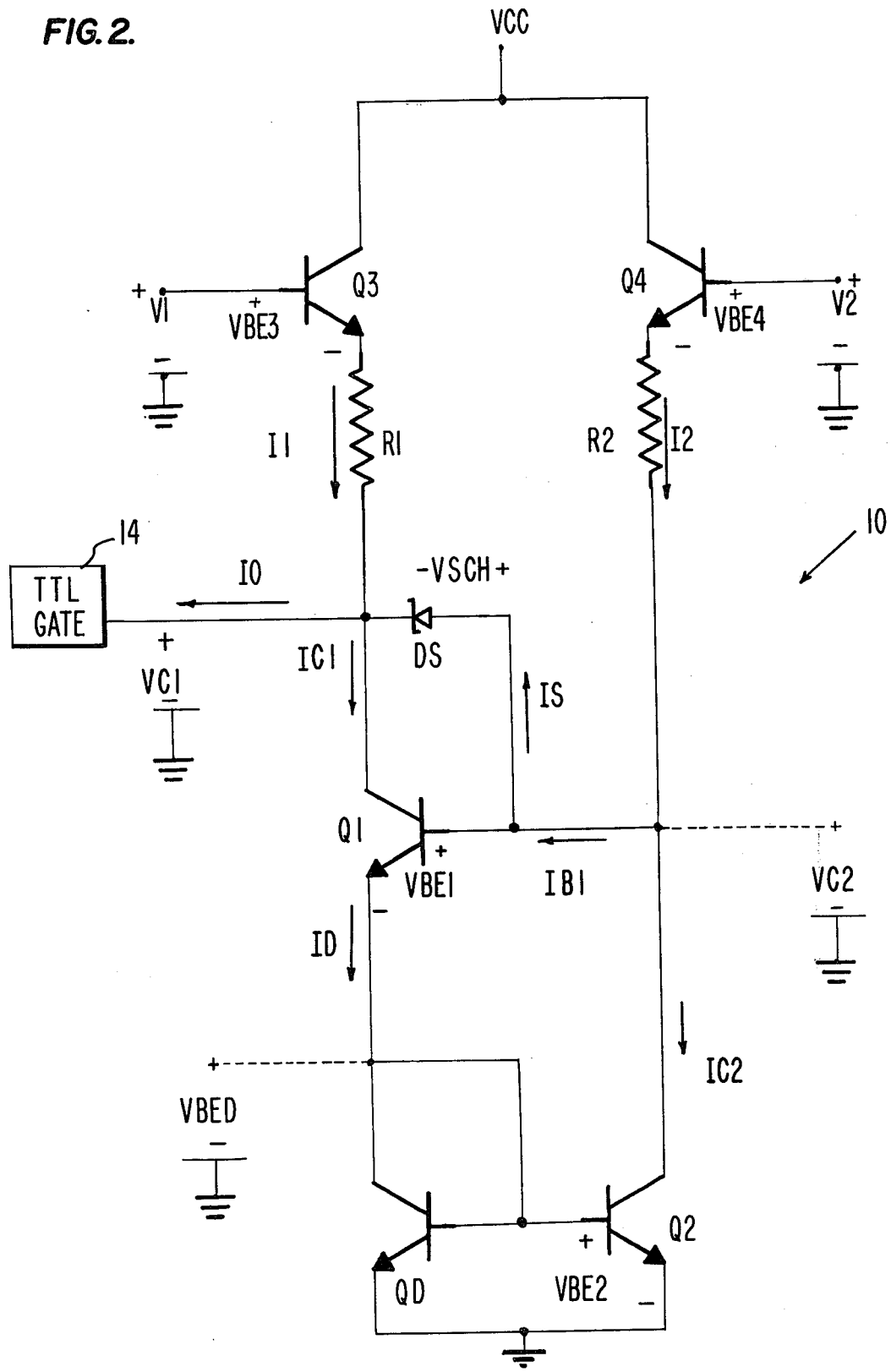

HIGH SPEED DIFFERENTIAL TO TTL CONVERTER

BACKGROUND OF THE INVENTION

This invention relates to an interfacing circuit arrangement for converting non-TTL signals into signals which are compatible with TTL-type logic. More particularly, it involves a high speed CML/ECL to TTL converter which operates at high speed.

In the design of large scale integrated circuit chips, it would be advantageous to be able to freely intermix different types of logic, for example, emitter coupled logic (ECL), current mode logic (CML), and transistor-transistor logic (TTL). However, the various types of logic operate on different voltage or signal levels. The precise levels differ from manufacturer to manufacturer but generally the difference between the two ECL/CML levels is less than the difference between the two TTL levels. The design of integrated circuit chips does not lend itself to employing two different power supply levels, one for the CML/ECL logic and another for the TTL logic. Consequently, in a single power supply chip, the CML/ECL logic signals must be converted back to TTL signals when the two types of logic are interfaced. The CML/ECL signals generally reference close to the power supply voltage, Vcc. By way of example, if the supply voltage Vcc is 5.0 volts, the two CML/ECL voltage levels might be 5.0 volts and 4.2 volts. In contrast, the TTL signals reference close to ground potential. Consequently, the two TTL signal levels might be at Vcc or 5.0 volts and 0.0 volts or ground. Hence it can be seen that the 4.2 volts CML/ECL voltage low level must be converted to a ground potential low level for the TTL gate. Conventional techniques have sensed a single ended CML/ECL signal and translated the signal through an extra level shifting network to provide a zero volt TTL signal when it sensed a 4.2 volt CML/ECL signal. The shifting network unfortunately adds extra delay to the conversion process. Furthermore, this technique requires tight design and process tolerances to maintain the CML/ECL voltage levels within closely defined voltages. For example, if the power supply, Vcc, has a wide tolerance then the prior art converter cannot distinguish between the high and low CML/ECL voltage levels. Moreover, since this technique senses only a single ended voltage swing on the preceding CML/ECL gate, the converter is susceptible to noise in the data transmission which can hamper proper operation.

U.S. Pat. No. 3,766,406 Bryant et al discloses such a prior art converter circuit. In addition to the above mentioned drawbacks, it requires a relatively large CML/ECL voltage swing in order to insure accurate conversion. This large voltage swing adds additional delay to the circuit. It would be advantageous to provide a CML/ECL to TTL converter that is capable of operating on a smaller voltage swing, preferably 400 mv, thereby increasing the speed of the circuit.

OBJECTS AND SUMMARY OF THE INVENTION

Therefore, it is the primary object of this invention to provide a high speed CML/ECL to TTL converter circuit that senses the CML/ECL signal differentially and converts it to a TTL level compatible signal.

It is a further object of this invention to accomplish the above objective without requiring closely defined CML/ECL signals with a comparatively large voltage swing.

Briefly, in accordance with the present invention a converter circuit is provided which senses the small differential voltage in the preceding gate, as compared to sensing only a comparatively large single ended voltage swing. The converter employs a current reflection or mirror technique to transform the voltage swing in the preceding gate into a TTL compatible signal by steering current into or out of the TTL gate. The operation of the circuit is dependent only upon matching of the devices rather than the absolute characteristics, such as power supply voltage and device characteristics. Consequently, the converter is particularly useful in an integrated circuit where matched devices present little problem. The converter circuit includes two parallel current paths in which the current in portions of each path is uniformly maintained by a current mirror circuit. Means are included in each current path for sensing the differential voltage in the non-TTL gate. The circuit will steer current into or out of the TTL gate depending upon the differential voltage sensed by the converter thereby selectively activating the TTL gate.

BRIEFLY DESCRIPTION OF THE DRAWINGS

Further features and advantages of this invention will become apparent upon consideration of the following detailed description on conjunction with the drawings in which:

FIG. 1 shows a schematic diagram in which one embodiment of the converter circuit of this invention is coupled between CML gate and a TTL gate; and FIG. 2 shows a circuit representation of the converter circuit shown in FIG. 1 in which various current and voltage levels in portions of the circuit are labeled.

DESCRIPTION OF THE PREFERRED EMBODIMENT

Figure 1:
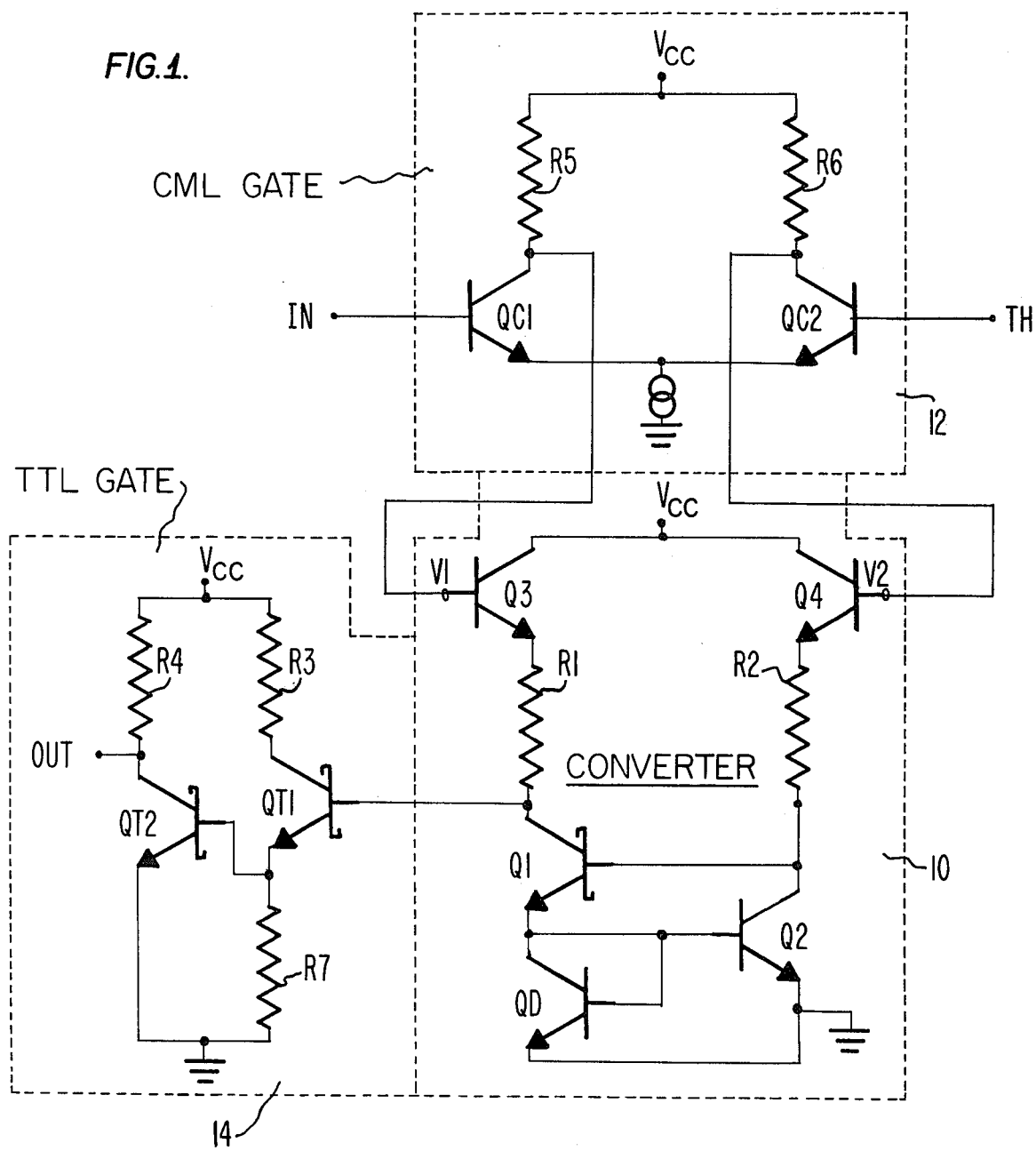

Referring now to the drawings, a preferred embodiment of the converter circuit 10 of this invention is shown interfacing a CML (current mode logic) gate 12 and a TTL (transistor-transistor logic) gate 14. The operation of the CML gate is well understood in the art. Briefly, it operates on a current steering principle in which current is steered into each leg of the cell depending upon the voltage level input at the bases of transistors QC1 and QC2. The base of QC2 can be biased at a threshold potential, TH, so that current from voltage supply Vcc will be diverted through R6 and QC2 into the grounded current source when the signal IN at QC1 renders it nonconductive. In such case the voltage level at the collector of QC2 is the difference between the voltage supply, Vcc, and the IR drop across resistor R6. When the signal IN is such that QC1 is conducting, almost all of the current is diverted through resistor R5 and transistor QC1. Consequently, the voltage level at the collector of QC1 is the difference between Vcc and the IR drop across R5, whereas the QC2 voltage returns to approximately Vcc. The difference in output voltage levels is about 400 mv, ranging from 5.0 volts (Vcc) to 4.6 volts in this example. This relatively small difference in signal swing provides extremely fast speed for the CML gate as compared with gates having a larger signal swing (e.g. ECL gates having a 800 mv swing). The output signals of the CML gate is typically read single-endedly by sensing the levels at only one of the transistors. The converter circuit 10, however, senses the voltage differential between the signals developed at transistors QC1 and QC2. It should be noted that while this invention is described in connection with a CML gate, the converter circuit may be used to convert any type of differential signal. For example, an analog signal or ECL gate signal may be converted by the present invention into TTL compatible signals. Therefore, for ease of description of this invention it will be described in connection with only a CML gate.

The operation of TTL gate 14 is similarly well known in the art. Briefly, the TTL gate 14 shown in the drawing has an input threshold level of two diode voltages representing the base-emitter drop across Schottky transistors QT1 and QT2. If the input voltage at the base of transistor QT1 is greater than this threshold, QT1 is turned on, which, in turn, turns on QT2. The base current to QT2 from QT1 saturates the QT2 transistor resulting in a low voltage, approximately at ground potential, thus representing for example a logical zero at the output, OUT. On the other hand, when the voltage input to QT1 falls below the two diode threshold level, QT1 and QT2 are turned off thereby raising the voltage level at the output OUT to Vcc representing a logical one.

The converter circuit 10 includes a high impedance current mirror circuit section including transistors QD and Q2. Schottky transistor Q1 is provided in the preferred embodiment to raise the quiescent voltage level of the converter circuit where it is coupled to TTL gate 14 to approximately the threshold level of TTL gate 14. If the TTL gate 14 has only a one diode voltage threshold level, then Q1 is unnecessary. For ease of description, a separate diode DS is shown in FIG. 2 coupled between the collector and base of transistor Q1 representing the diode portion of the transistor. Transistor QD has its base and collector shorted together and consequently functions as a diode. The base of transistor QD is coupled to the base of transistor Q2. The emitters of transistors QD and Q2 are coupled to a reference potential such as ground shown in the drawings. The collector of Q2 is coupled to the base of transistor Q1. The collector of transistor QD is coupled to the emitter of transistor Q1. This current mirror section provides two parallel current paths in which the amount of current in each path is maintained uniform. With reference to FIG. 2, ID will always equal IC2. Hence, the current in one path is a mirror image of the current in the other path. This is due to the fact that the bases of QD and Q2 are biased at the same potential since they are coupled together. Since QD and Q2 are matched devices, their emitter currents will be the same. Consequently, their collector currents ID and IC2, respectively, will remain equal since the current gain factor (Beta) of the transistors is much greater than one and there is negligible base current.

The collector of Q2 and base of Q1 are coupled through a resistor R2 to the emitter of transistor Q4. Similarly, the collector of Q1 is coupled to the emitter of Q3 through a second resistor R1. Both resistors are of equal value and Q3 and Q4 are matched devices. The collectors of transistors Q3 and Q4 are coupled to a power supply voltage Vcc of about 5.0 volts in this example. Transistors Q3 and Q4 sense the differential voltage of CML gate 12 during its operation. The base of transistor Q3 is coupled to the collector of transistor QC1 of CML gate 12. Similarly, the base of transistor Q4 is coupled to the collector of transistor QC2. Thus, the converter circuit 10 is coupled to CML gate 12 in an emitter follower configuration. The advantage of the emitter follower configuration is that it presents little loading to the CML gate 12 since it has a high input impedance and low output impedance. Consequently, overall delay time is minimized. If QC1 of CML gate 12 is conducting, the voltage V1 at the base of transistor Q3 will be at a potential determined by the IR drop across transistor R5 substracted from the power supply voltage Vcc. If QC1 is not conducting (representing a low signal at IN) then V1 will be at the Vcc potential. The voltage V2 at the base of Q4 will similarly be determined by the state of transistor QC2 of CML gate 12.

The nomenclature of FIG. 2 will be referred to in describing the operation of converter circuit 10. The current gain factor, beta (B), is much greater than one for the transistors in converter 10 and consequently the base current to the transistors is negligible. Since QD and Q2 are matched devices, the current through each device will be the same, i.e. ID equals IC2. Since the current IB1 to transistor Q1 is negligible, the collector to emitter current IC1 of transistor of Q1 also equals the collector to emitter current IC2 of transistor Q2. Therefore, $$IC1 = ID = IC2 \qquad (1)$$

The current in this current mirror circuit section will always be substantially the same regardless of the input voltages, (V1, V2) to the base of transistors Q3 and Q4 from CML gate 12.

Assume now that V1 equals V2 and that there is no current IO drawn to the base of transistor QT1 of TTL gate 14. In such case, the emitter currents I1 and T2 emanuating from transistors Q3 and Q4 will be the same. Therefore, VC1 will be equal to VC2 which in turn is equal to the forward bias emitter voltage VBE1 of transistor Q1 plus the voltage drop VBED across the diode QD at equilibrium. This can be represented by the equation $$VC1 = VC2 = VBE1 + VBED \qquad (2)$$

When the voltage V2 at the base of transistor Q4 is greater than the voltage V1 at the base of transistor of Q3 representing a differential voltage created in CML gate 12 (e.g. due to a logical one input at IN of CML gate 12), then the emitter current I2 from transistor Q4 can be represented by the equation $$I2 = (V2\text{-}VBE4\text{-}VBE1\text{-}VBED/R) \qquad (3)$$

where R represents the resistance value of R1 or R2. The emitter current I1 will also be equal to the emitter current I2 due to the current reflection characteristics of the current mirror circuit section which it is coupled. When V2 is greater than V1, the output voltage VC1 connected to the input of the TTL gate 14 is determined by the equation $$VC1 = VI - I_1 R - VBE3 \qquad (4)$$

since $I_1 = I_2$, substituting equation (3) for $I_1$ $$VC1 = V1 - (V2 - VBE4 - VBE1 - VBED/R)(R) -$$
$$VBE3 = V1 - V2 + VBE4 + VBE1 + VBED - VBE3$$

Since Q3 and Q4 are also matched devices and consequently VBE4 equals VBE3, then $$VC1 = V1 - V2 + VBE1 + VBED = VBE1 + VBED - \Delta V \quad (5)$$

Consequently, when the converter circuit 10 is interfaced with a TTL gate 14 which has a two diode voltage drop threshold level, the differential voltage of CML gate 12 is directly translated by the circuit 10 into lowering the voltage at VC1 below the threshold level of the TTL gate 14 when V2 is greater than V1. Thus, when the differential voltage develop in CML gate 12 is such that V2 is greater than V1, the converter circuit 10 will turn off the TTL gate 14 since VC1 will be lower than the threshold level of the TTL gate. Therefore, the output voltage OUT of TTL gate 14 is approximately at Vcc representing a logical one at a TTL level compatible signal level in response to a logical one input IN for CML gate 12.

If the differential voltage ($\Delta V$) is greater than approximately one diode voltage (about 0.8 volts), the voltage level of VC1 will be clamped by the Schottky clamp diode of transistor Q1 to VC2-VSCH. In such case, the Schottky diode portion of transistor Q1 will be forward biased and part of the current I2 will be shunted through the Schottky diode in order to maintain the current reflection requirement of IC1 equal to IC2. Furthermore, the low forward voltage and high speed characteristics of a Schottky diode helps to prevent transistor Q1 from going into deep saturation.

When the differential voltage is greater than the forward voltage of Schottky diode portion of Q1, the current IC1 is equal to the summation of the current I1 plus IS. The current IC2 in the other leg of the current reflection section is equal to the current I2 minus IS (where IS is approximately equal to IB1 due to the high current gain factor, beta, of the transistor). Consequently, since IC1 equals IC2

$$I1 + IS = I2 - IS \quad (6)$$
$$2IS = I2 - I1$$
$$= \left(\frac{V1 - VC1 - VBE3}{R}\right) - \left(\frac{V2 - VC2 - VBE4}{R}\right)$$
$$= \frac{V2 - V1 - (VC2 - VC1) - VBE4 + VBE3}{R}$$

Since VC1 is clamped at VC2-VSCH, then $$VC2 - VC1 = VSCH \quad (7)$$

Also, since $$VBE4 = VBE3 \quad (8)$$

Substituting equations (7) and (8) into equation (6) gives:

$$2IS = \frac{(V2 - V1) - VSCH}{R} \quad (9)$$
$$IS = \frac{\Delta V - VSCH}{2R}$$

Therefore, it can be seen that the Schottky diode current IS is dependent upon the differential voltage created in CML gate 12. The purpose of this current will become more apparent later in the description of the preferred embodiment.

Assume now that the voltage V1 at the base of transistor Q3 is now greater than the voltage V2 at the base of transistor Q4, for example, due to a logical zero input at IN of CML gate 12. Accordingly, from equation (5)

$$VC1 = VBE1 + VBED - (V2 - V1) = VBE1 + VBED + \Delta V \quad (10)$$

Accordingly, when the differential voltage in CML gate 12 is such that V1 is greater than V2, the circuit 10 translates the differential voltage directly into raising the voltage at VC1 above the threshold level of the TTL gate 14 thus turning on the gate. In contrast, if V2 is greater than V1, the circuit 10 would turn off the TTL gate 14.

When the converter circuit 10 is coupled to the TTL gate 14 as shown in the drawing, current is steered into or out of TTL gate 14 to quickly turn it on or off depending upon the differential voltage sensed in CML gate 12. After the TTL gate is turned on, it clamps the voltage at VC1 to approximately its threshold voltage which is two diode levels above ground. This is the same voltage level as VC2 which is also approximately two diode voltages above ground. In such case, a turn on overdrive current I0 is created which minimizes delay in turning on the TTL gate 14 by inducing charge into the gate. The amount of overdrive turn on current can be derived as follows:

$$I0 = I1 - IC1 \quad (11)$$

since IC1 equals IC2 which equals I2, then $$I0 = I1 - I2 \quad (12)$$
$$= \left(\frac{V1 - VC1 - VBE3}{R}\right) - \left(\frac{V2 - VC2 - VBE4}{R}\right)$$
$$= \left(\frac{V1 - V2}{R}\right) - \left(\frac{VC1 - VC2}{R}\right)$$

But since VC1 is approximately the same as VC2 when clamped by the TTL gate, the last term is negligible. Therefore, $$I0 = \frac{V1 - V2}{R} \quad (13)$$
$$= \frac{\Delta V}{R}$$

Accordingly, after the circuit has turned on the TTL gate 14, the differential voltage is used to provide a turn on overdrive current to the TTL gate.

Assume now that the input signals V1 and V2 are switched back to their opposite state, i.e. V2 is now greater than V1 representing a change in differential voltage in CML gate 12. For a small duration of time the transistor QT1 in TTL gate 14 will still be conducting due to the stored charge in the base of the transistor. Consequently, the voltage of VC1 is maintained at the same level as VC2, that being approximately two diode voltages above ground. Under such conditions there is a turn off overdrive current created which will remove charge in the TTL gate thereby minimizing delay in turning the gate off. The amount of turn off overdrive is similarly a function of the differential voltage between V1 and V2, as is the turn on overdrive. In effect, the the converter circuit 10 "pulls out" current from the TTL gate 14 in order to quickly turn off the gate. Since now V2 is greater than V1 which is a negative $\Delta V$, the turn off overdrive to TTL gate 14 is, pursuant to equation (13)

$$I0 = - \Delta V/R \qquad (14)$$

Hence, it can be seen that the magnitude of turn off overdrive is equal to the magnitude of turn on overdrive for a symmetrical differential swing at the inputs of V1 and V2. This unique turn on and turn off overdrive capability thus minimizes the overall delay time to the TTL gate the converter circuit interfaces.

In the CML gate 12 of this example, the differential voltage swing generally does not exceed one diode voltage. However, even if the input voltage swing does exceed a diode voltage and causes the Schottky clamp transistor Q1 to saturate, little delay is added to the circuit. This is because Q1 remains in saturation after the inputs V1 and V2 are switched to the opposite state. Consequently, the saturated transistor Q1 would sink excess current into transistor QD. However, since by current reflection IC2 always equals IC1. Also, $$IC1 = \frac{V1 - VC1}{R} \qquad (15)$$

and $$IC2 = \frac{V2 - VC2}{R} \qquad (16)$$

with $$IB1 = I2 - IC2 \qquad (17)$$

$$= \left(\frac{V2 - VC2}{R}\right) - \left(\frac{V1 - VC1}{R}\right)$$

$$= \left(\frac{V2 - V1}{R}\right)\left(\frac{VC2 - VC1}{R}\right)$$

since $VC2 - VC1 = VSCH$, then $$IB1 = \frac{V + VSCH}{R} \qquad (18)$$

By comparison with equation (9) it can be seen that turn off overdrive is much greater than the initial turn on overdrive to Q1 before the input state is switched. Therefore, storage delay time is minimal thereby reducing the delay of TTL gate 14.

The present invention eliminates the need of an extra level shifting network which would introduce extra delay into the logic signal path. The inputs of the present invention directly interface with the CML circuit and provides a TTL compatible output with minimal delay. Moreover, the emitter follower configuration of the input of the converter circuit coupled with the structure of the current mirror section results in a very high impedance. Therefore, the converter circuit 10 provides only minimal loading to the preceding CML stage. Since the converter circuit 10 senses the voltage swing of CML gate 12 differentially, the converter circuit has excellent common node rejection properties which render it substantially immune to common mode noise signals from the preceding stage. It is also important to note that by sensing the preceding stage differentially, the converter circuit is insensitive to variations in the power supply voltage Vcc of the CML gate 12. Consequently, the tolerance requirements of the integrated circuit chip are lessened inasmuch as the converter circuit 10 senses the CML gate voltage levels differentially as compared to the prior art method of sensing a single ended voltage swing. The converter circuit of the present invention also is particularly suitable for integrated circuit devices since the operation of the circuit depends only upon device matching characteristics which are readily attainable in integrated circuit manufacturing, rather than absolute device parameters.

It is important to note that the present invention differs from the convention converter circuits in that it eliminates the requirement of generating a comparatively large voltage swing in order to make it compatible with a TTL voltage level. In contrast, the converter circuit of the present invention uses the differential voltage swing of the CML gate to either raise or lower the output of the converter circuit to above or below the threshold voltage of the TTL gate in order to turn the TTL gate on or off. Therefore, the TTL gate can respond even to a relatively small differential swing at the inputs of the converter circuit. This reduction in voltage swing reduces the charge and discharge time associated with the parasitic capacitance of the preceding CML stage.

Therefore, while this invention has been described in connection with a particular embodiment thereof, no limitation is intended thereby except as defined in the appended claims.

What is claimed is:

1. A converter circuit for converting a differential signal of one circuit to a TTL gate compatible signal, said converter circuit comprising:
    means for sensing the differential voltage level of said one circuit, said sensing means including first and second transistors each having base, output and common electrodes in which the base of each transistor is coupled to said one circuit for sensing the differential coltage signal developed therein;
    means defining a current mirror circuit coupled to said sensing means; and
    means coupled between said sensing means and said current mirror means for supplying a compatible signal to said TTL gate to turn said TTL gate on or off depending upon the differential voltage in said one circuit.

2. In a logic circuit having a TTL gate and a second non-TTL gate developing differential voltage levels, a converter circuit for converting said non-TTL gate voltage levels to TTL gate compatible signals, said converter circuit comprising:
    two parallel current paths;
    a transistor in each path having its base coupled to said non-TTL gate for sensing the differential voltage levels therein;
    means defining a current mirror circuit coupled to each of said transistors, said current mirror circuit including a third transistor having its collector coupled to one of said transistors in a current path and a fourth transistor having its base and collector shorted together, the bases and admitters of said third and fourth transistors being coupled together, respectively; and means in one of said current paths coupled between said current mirror circuit and one of said transistors in a current path for steering current into or out of said TTL gate depending upon the differential voltage level of said non-TTL gate.

3. In a logic circuit having a TTL gate and a CML-type gate, a converter circuit for converting CML signals to TTL compatible signals, said converter circuit comprising:

first and second bipolar transistors in which the base of each transistor is coupled to said CML gate for sensing the differential voltage signal developed therein;

a current path emanating from the emitters of each of said transistors;

first and second resistors of equal value in each of said current paths;

a current mirror circuit coupled to each of said resistors, said current mirror circuit including a third bipolar transistor having its collector coupled to said second resistor, a fourth bipolar transistor having its base and collector shorted together, the bases and emitters of said third and fourth transistors being coupled together, respectively; and means in one of said current paths between said current mirror circuit and one of said resistors for steering current into or out of said TTL gate depending upon the differential voltage level of said CML gate.

4. In a logic circuit having TTL gate with a two diode voltage threshold level and a CML-type gate, a converter circuit for converting CML signals to TTL compatible signals, said converter circuit comprising:

first and second bipolar transistors in which the base of each transistor is coupled to said CML gate for sensing the differential voltage signal developed therein;

a current path emanating from the emitters of each of said transistors;

first and second resistors of equal value in each of said current paths;

a current mirror circuit coupled to each of said resistors, said current mirror circuit including a third bipolar transistor having its collector coupled to said second resistor, a fourth bipolar transistor having its base and collector shorted together, the bases and emitters of said third and fourth transistors being coupled together, respectively;

a Schottky bipolar transistor with its base coupled between said second resistor and the collector of said third transistor, the emitter of said Schottky transistor being coupled to the collector of said fourth transistor, and the collector of said Schottky transistor being coupled to said first resistor; and means coupled between the Schottky transistor collector and said first resistor for steering current into or out of said TTL gate depending upon the differential voltage level of said CML gate.

* * * * *

UNITED STATES PATENT OFFICE
CERTIFICATE OF CORRECTION

Patent No. 4,045,690    Dated August 30, 1977

Inventor(s) Richard K.W. Tam

It is certified that error appears in the above-identified patent and that said Letters Patent are hereby corrected as shown below:

Col. 4, line 38, change "T2" to read --I2--.

Col. 4, line 39, change "emanuating" to read --emanating--.

Col. 4, line 53, change "12" to read --I2--.

Col. 4, line 59, change "12" to read --I2--.

Col. 4, line 65, change "VI" to read --V1--.

Col. 6, line 39, change "12" to read --I2--.

Col. 8, line 50, change "coltage" to read --voltage--.

Signed and Sealed this

Twentieth Day of December 1977

[SEAL]

Attest:

RUTH C. MASON
Attesting Officer

LUTRELLE F. PARKER
Acting Commissioner of Patents and Trademarks